(12) United States Patent
Gunaji et al.

(10) Patent No.: US 12,020,957 B2
(45) Date of Patent: Jun. 25, 2024

(54) HEATER ASSEMBLY WITH PROCESS GAP CONTROL FOR BATCH PROCESSING CHAMBERS

(71) Applicant: Applied Materials, Inc., Santa Clara, CA (US)

(72) Inventors: Akshay Gunaji, Karnataka (IN); Tejas Ulavi, San Jose, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 960 days.

(21) Appl. No.: 17/008,588

(22) Filed: Aug. 31, 2020

(65) Prior Publication Data
US 2022/0068674 A1  Mar. 3, 2022

(51) Int. Cl.
| | |
|---|---|
| H01L 21/67 | (2006.01) |
| C23C 16/455 | (2006.01) |
| C23C 16/46 | (2006.01) |
| F27D 5/00 | (2006.01) |
| H01L 21/687 | (2006.01) |
| H05B 3/22 | (2006.01) |

(52) U.S. Cl.
CPC .. H01L 21/67103 (2013.01); C23C 16/45544 (2013.01); C23C 16/46 (2013.01); F27D 5/0037 (2013.01); H01L 21/68771 (2013.01); H05B 3/22 (2013.01)

(58) Field of Classification Search
CPC ........ H01L 21/67103; H01L 21/68771; C23C 16/45544; C23C 16/46; F27D 5/0037; H05B 3/22

USPC ....................................................... 219/444.1
See application file for complete search history.

(56) References Cited

U.S. PATENT DOCUMENTS

| | | | |
|---|---|---|---|
| 5,368,648 A | 11/1994 | Sekizuka et al. | |
| 5,796,074 A * | 8/1998 | Edelstein | C23C 16/4586 219/390 |
| 6,730,175 B2 * | 5/2004 | Yudovsky | C23C 16/4586 156/345.52 |
| 6,734,090 B2 | 5/2004 | Agarwala et al. | |
| 9,202,727 B2 | 12/2015 | Dunn et al. | |
| 2003/0015516 A1 * | 1/2003 | Natsuhara | H01L 21/67103 219/390 |
| 2004/0177812 A1 * | 9/2004 | Goto | C23C 16/4586 118/725 |
| 2005/0082274 A1 * | 4/2005 | Kondou | H05B 3/143 219/544 |
| 2010/0317197 A1 | 12/2010 | Lind et al. | |

(Continued)

FOREIGN PATENT DOCUMENTS

| | | |
|---|---|---|
| CN | 103374712 A | 10/2013 |
| TW | 201814823 A | 4/2018 |
| WO | 2020028145 A1 | 2/2020 |

OTHER PUBLICATIONS

PCT International Search Report and Written Opinion in PCT/US2021/048216 dated Dec. 1, 2021, 10 pages.

*Primary Examiner* — Jimmy Chou
(74) *Attorney, Agent, or Firm* — Servilla Whitney LLC

(57) ABSTRACT

A heater assembly having a top seal and a second seal configured to account for deviation in processing heights and motor runoff of a heater standoff. The top seal is positioned between a shield plate and a top plate and the bottom seal is positioned between a heater mounting base and the heater standoff.

18 Claims, 11 Drawing Sheets

(56) References Cited

U.S. PATENT DOCUMENTS

| | | | | |
|---|---|---|---|---|
| 2012/0033340 A1* | 2/2012 | Roy | ................ | H01L 21/67103 |
| | | | | 361/234 |
| 2013/0126515 A1* | 5/2013 | Shero | ................ | H01L 21/67115 |
| | | | | 219/448.11 |
| 2015/0096973 A1* | 4/2015 | Dunn | ................ | H01L 21/67103 |
| | | | | 165/104.34 |
| 2016/0021707 A1* | 1/2016 | Ibrani | ................ | H01L 21/68792 |
| | | | | 219/634 |
| 2016/0358808 A1* | 12/2016 | Madsen | ................ | C23C 16/50 |
| 2018/0105934 A1* | 4/2018 | Jang | ................ | H01L 21/68785 |
| 2018/0218885 A1* | 8/2018 | Maeda | ................ | H01J 37/32724 |
| 2019/0043698 A1 | 2/2019 | Parkhe | | |
| 2019/0360100 A1* | 11/2019 | Nguyen | ................ | C23C 16/505 |
| 2019/0378696 A1* | 12/2019 | Addepalli | ................ | H01J 37/32651 |

* cited by examiner

HEATER ASSEMBLY WITH PROCESS GAP CONTROL FOR BATCH PROCESSING CHAMBERS

TECHNICAL FIELD

Embodiments of the disclosure generally relate to heater assemblies for batch processing chambers. In particular, embodiments of the disclosure are directed to heater assemblies comprising integrated thermal isolation shields.

BACKGROUND

In some chamber designs for atomic layer deposition (ALD) or chemical vapor deposition (CVD) processing, precursors and gases are delivered to a large substrate support or multiple substrate support surfaces through multiple gas distribution plates at the same time. The gas distribution plates are spaced from the substrate surfaces, or vice versa, forming one or more operational gaps. Such chambers can be highly sensitive to the consistency and uniformity of the gaps between different process stations and over time as the chamber is used. With gaps of about one millimeter for some multi-station deposition systems, the processes performed in the separate stations can be highly susceptible to small gap deviations.

Many processing systems and processing tools operate with very tight space requirements. For example, a multi-substrate ALD chamber can process with 0.8 to 1.5 mm between the substrate surface and the gas distribution system. These small spaces minimize chemistry consumption by reducing process volume, minimize ALD cycle time and purge time and maximize throughput.

Large volume batch processing chambers often suffer from variance in alignment of heater assemblies relative to processing stations, resulting in deviations in processing gaps and processing volumes between the heater assemblies and processing stations. Deviations in processing gaps and processing volume impact the repeatability of the process and the thermal uniformity of the heater. Leveling systems and methods of conventional processing chambers use complicated and expensive systems for measurement and alignment of the heaters. These motorized systems are subject to failure due to normal wear-and-tear of the components, resulting in chamber downtime for repairs and preventative maintenance.

Therefore, there is a need in the art for apparatus and methods for controlling the gap between the substrate support(s) and gas distribution assembly(s).

SUMMARY

One or more embodiments of the disclosure are directed to heater assemblies comprising a heater, a heater standoff a shield shaft and a shield plate. The heater has a support surface and a bottom surface defining a thickness. The heater standoff has a top end in contact with the bottom surface of the heater. The shield shaft has a top end and a bottom end, an inside surface surrounding an open interior region and an outside surface. The heater standoff located within the open interior region and the top end of the heater standoff extending above the top end of the shield shaft. The shield plate has a top surface, a bottom surface and an outer peripheral edge. The shield plate further includes an opening extending from the top surface to the bottom surface in an inner portion. The heater standoff extending through the opening in the shield plate and the bottom surface of the heater is spaced a distance from the top surface of the shield plate. The top surface of the shield plate has a groove with an inner face and an outer face extending around a peripheral portion of the shield plate. The outer face of the shield plate is spaced a distance from the outer peripheral edge of the shield plate.

Additional embodiments of the disclosure are directed to a substrate support having a center base, a heater assembly and a top plate. The plurality of arms extending therefrom, each arm having an inner end in contact with the center base and an outer end. The heater assembly is connected to the outer end of each arm and comprises a heater, a heater standoff, a shield shaft and a shield plate. The heater has a support surface and a bottom surface defining a thickness. The heater standoff has a top end in contact with the bottom surface of the heater. The shield shaft has a top end and a bottom end, an inside surface surrounding an open interior region and an outside surface. The heater standoff located within the open interior region and the top end of the heater standoff extending above the top end of the shield shaft. The shield plate has a top surface, a bottom surface and an outer peripheral edge. The shield plate further includes an opening extending from the top surface to the bottom surface in an inner portion. The heater standoff extending through the opening in the shield plate and the bottom surface of the heater is spaced a distance from the top surface of the shield plate. The top surface of the shield plate has a groove with an inner face and an outer face extending around a peripheral portion of the shield plate. The outer face of the shield plate is spaced a distance from the outer peripheral edge of the shield plate. The top plate has a top surface and a bottom surface defining a thickness of the top plate, the top plate having an opening through the thickness to allow the heater to pass through the opening, the bottom surface of the top plate in contact with the fluid seal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
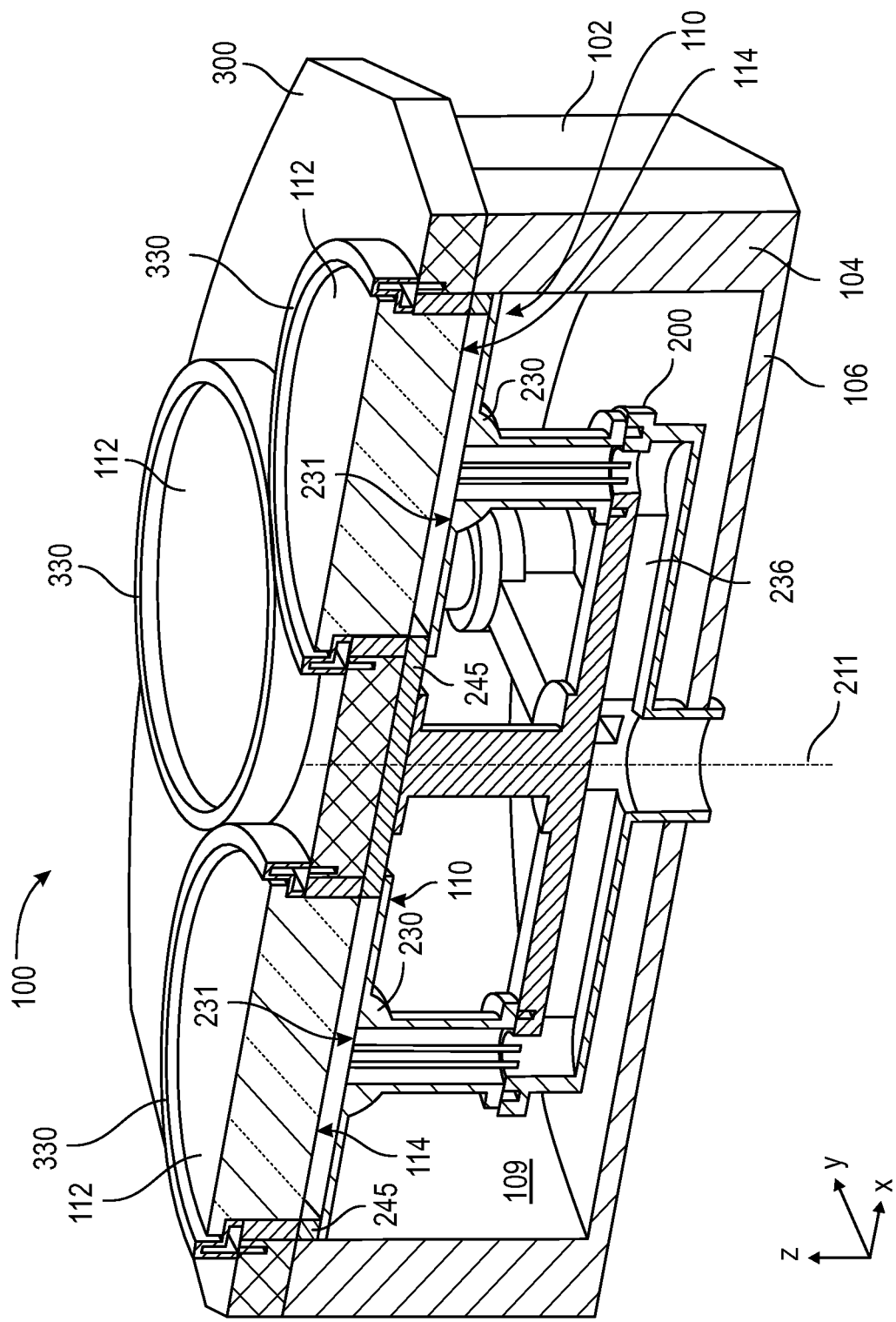
FIG. 1 shows a cross-sectional isometric view of a processing chamber in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Some embodiments of the disclosure advantageously provide cost effective solutions using O-rings to level the heaters for process gap control without complicated motorized systems. Some embodiments provide ways to integrate heaters with thermal isolation shields, heater leveling capabilities and/or process volume isolation for single wafers in a multi-wafer process chamber.

Some embodiments of the present disclosure provide for a heater assembly integrated to a thermal shield assembly (also referred to as a heater shield assembly), forming a uniform cavity around a heater standoff. The heater shield assembly comprises a shield plate and a shield shaft. The heater shield assembly further comprises fluid seals between the shield plate and shield shaft configured to seal against leakage and maintain vacuum integrity. The thermal shield of some embodiments increases the uniformity of temperature loss around the heater.

Figure 2:
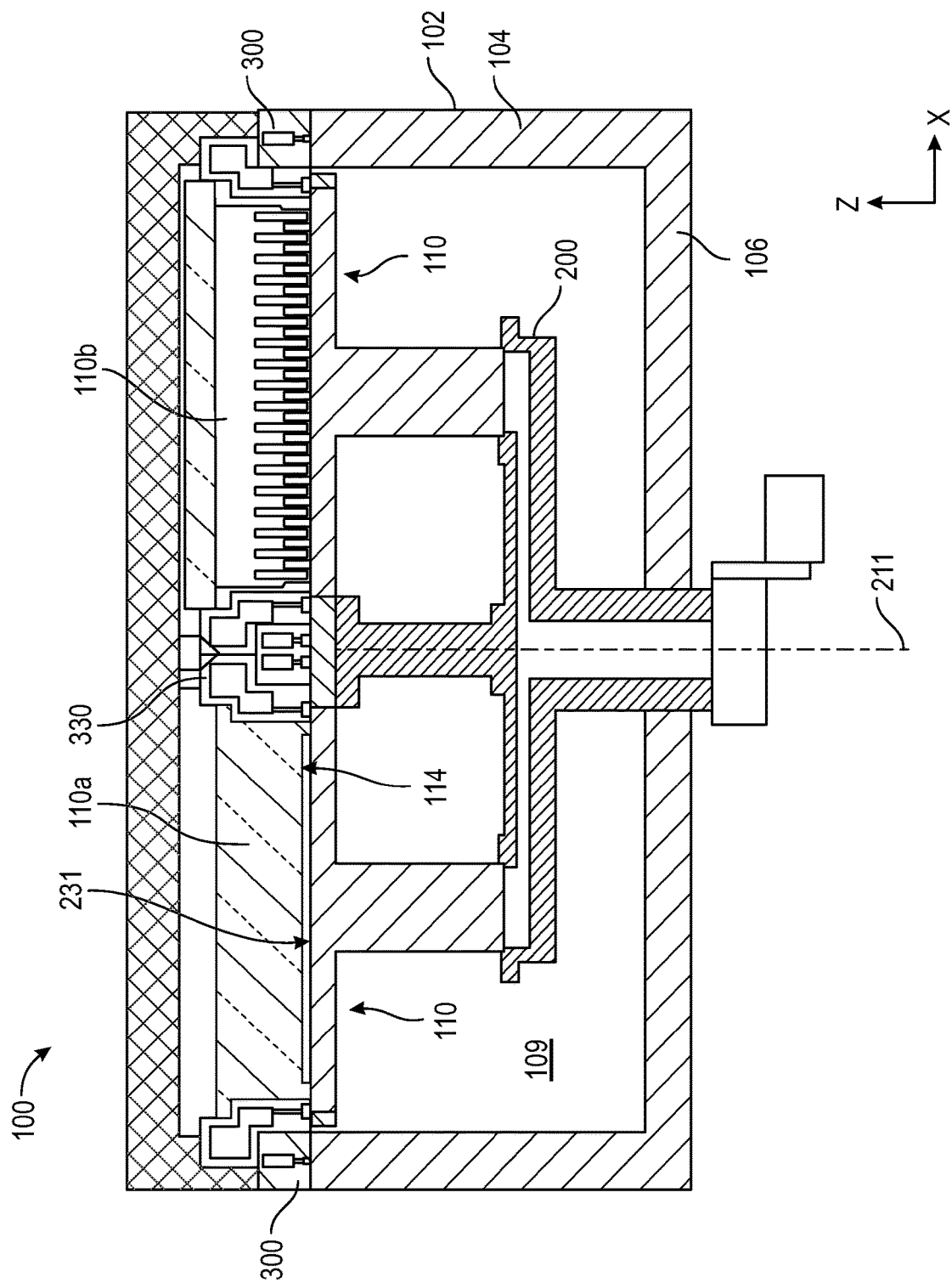
FIG. 2 shows a cross-sectional view of a processing chamber in accordance with one or more embodiments of the disclosure.
Figure 3:
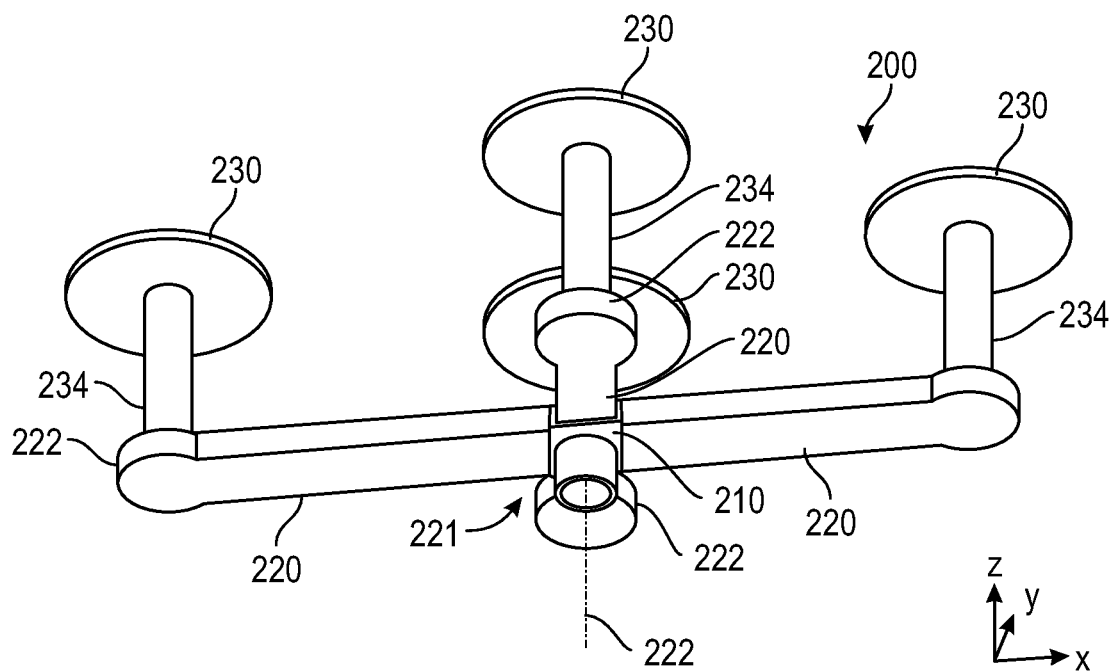
FIG. 3 shows a bottom perspective view of a support assembly in accordance with one or more embodiment of the disclosure.

The disclosure provides substrate supports for use with single substrate or multi-substrate (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. FIGS. 3 through 6 illustrate support assemblies 200 in accordance with one or more embodiments of the disclosure.

The processing chamber 100 has a housing 102 with sidewalls 104 and a chamber floor 106. The housing 102 along with the chamber lid 300 define a processing volume 109, also referred to as an interior volume 109.

The processing station 110 illustrated comprises three main components: the chamber lid 300 (also called a lid), a pump/purge insert 330 and a gas injector 112. The processing chamber 100 further includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200. Each of the heaters 230 comprising the support surface 231 and a bottom surface 232 defining a thickness of the heaters 230. In some embodiments, the support surface 231 further includes provisions for at least three lift pins extending through the support surface 231

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

FIGS. 3 through 6 illustrate support assemblies 200 in accordance with one or more embodiments of the disclosure. The support assembly 200 includes a rotatable center base 210. The rotatable center base 210 can have a symmetrical or asymmetrical shape and defines a rotational axis 211. The rotational axis 211, as can be seen in FIG. 6, extends in a first direction. The first direction may be referred to as the vertical direction or along the z-axis; however, it will be understood that the use of the term "vertical" in this manner is not limited to a direction normal to the pull of gravity.

The support assembly 200 includes at least two support arms 220 connected to and extending from the center base 210. The support arms 220 have an inner end 221 and a heater mounting base 222. The inner end 221 is in contact with the center base 210 so that when the center base 210 rotates around the rotational axis 211, the support arms 220 rotate as well. The support arms 220 can be connected to the center base 210 at the inner end 221 by fasteners (e.g., bolts) or by being integrally formed with the center base 210.

In some embodiments, the support arms 220 extend orthogonal to the rotational axis 211 so that one of the inner ends 221 or heater mounting bases 222 are further from the rotational axis 211 than the other of the inner ends 221 and heater mounting bases 222 on the same support arm 220. In some embodiments, the inner end 221 of the support arm 220 is closer to the rotational axis 211 than the heater mounting base 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotation axis 211. In some embodiments, the support assembly 200 has n-number of support arms 220 and the n-number of support arms 220 are arranged to provide n-fold symmetry around the rotation axis 211.

A heater 230 is positioned at the heater mounting base 222 of the support arms 220. In some embodiments, each support arm 220 has a heater 230. The center of the heaters 230 are located at a distance from the rotational axis 211 so that upon rotation of the center base 210 the heaters 230 move in a circular path.

The heaters 230 have a support surface 231 which can support a substrate. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the heater mounting base 222 of the support arms 220. In some embodiments, as illustrated in the drawings, the heaters 230 are elevated above the heater mounting base 222 of the support arms 220 by a heater standoff 234. The heater standoffs 234 have a substantially cylindrical body and can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body.

Figure 4:
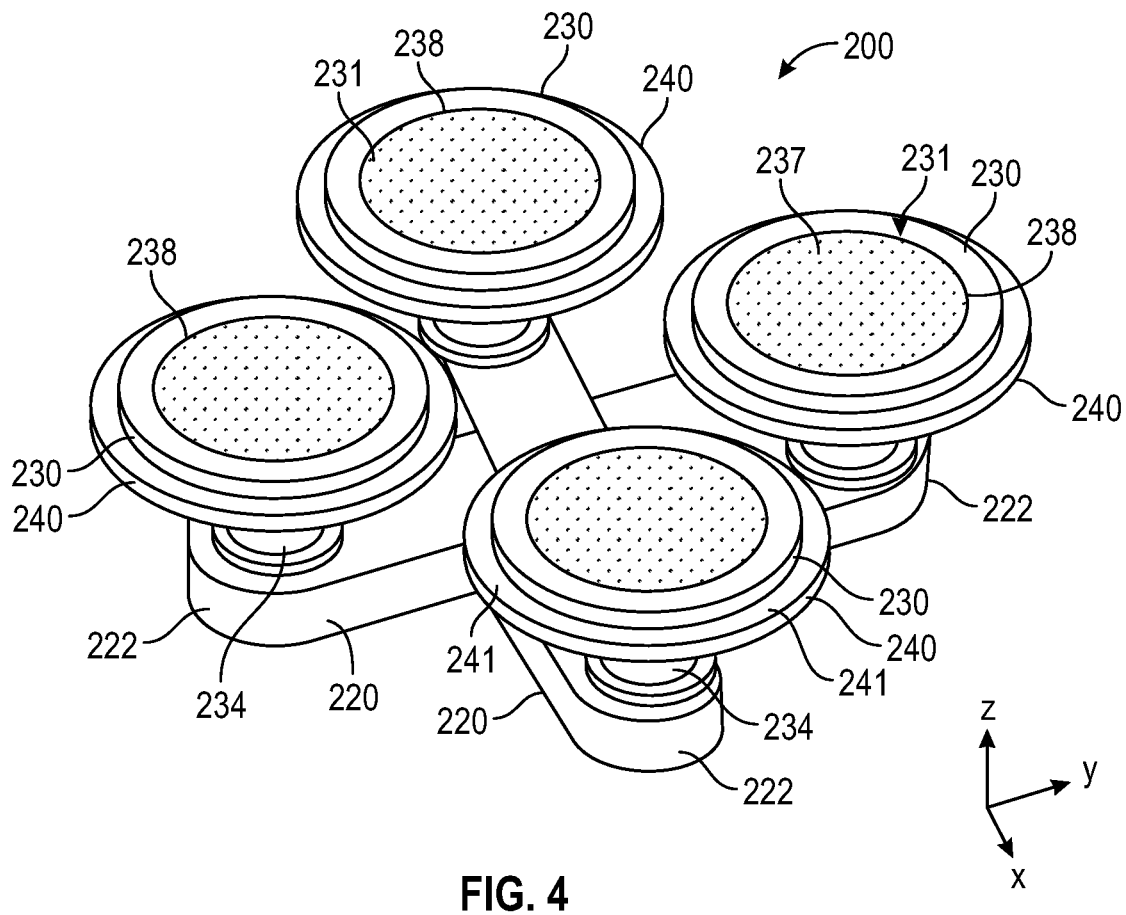
FIG. 4 shows a top perspective view of a support assembly in accordance with one or more embodiment of the disclosure.

In some embodiments, as shown in FIG. 4, the shield plates 240 are discoid shaped and are positioned around each heater 230. In the illustrated embodiment, the shield plates 240 are located below the heater 230 so that the top surface 241 of the shield plate 240 is below the support surface 231 of the heater.

The heaters 230 of some embodiments include additional components. For example, the heaters of some embodiments comprise electrostatic chucks. The electrostatic chuck can include various wires and electrodes so that a substrate positioned on the support surface 231 can be held in place while the heater is moved. This allows a substrate to be chucked onto a heater at the beginning of a process and remain in that same position on that same heater while moving to different process regions. In some embodiments, the wires and electrodes are routed through the channels 236 in the support arms 220. The electrostatic chuck is configured as a chucking surface disposed within the heater 230.

Figure 5:
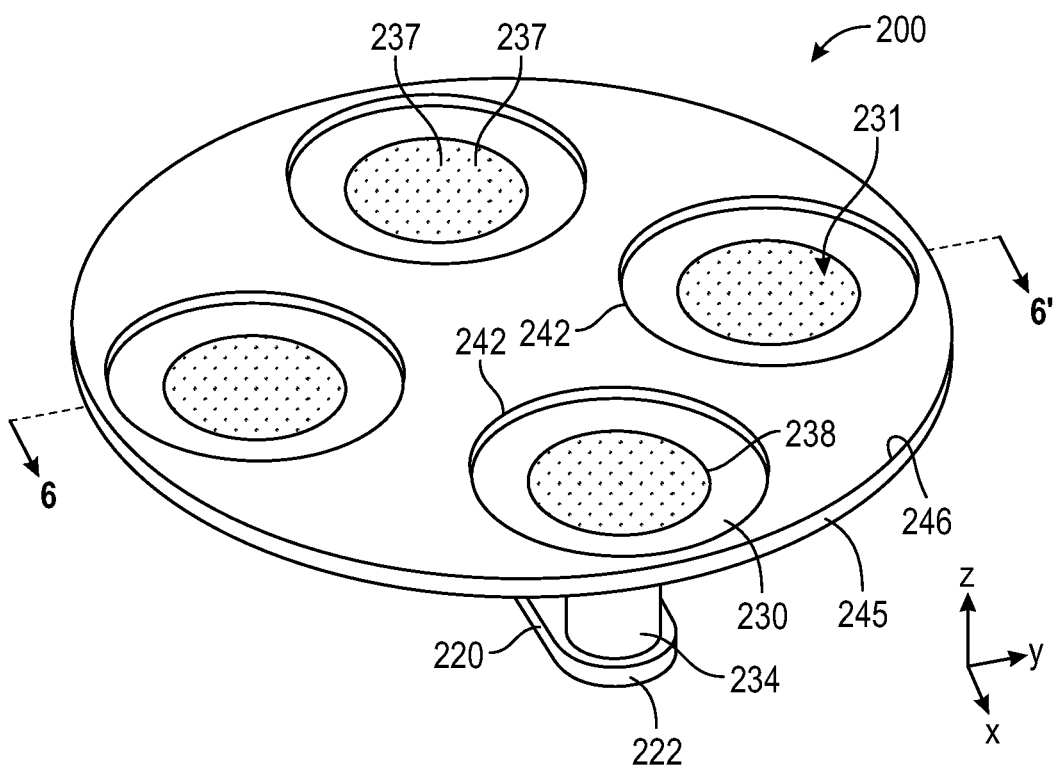
FIG. 5 shows a top perspective view of a support assembly in accordance with one or more embodiment of the disclosure.

In some embodiments, as shown in FIG. 5, the top plate 245 is a single component that surrounds all of the heaters 230 with at least one opening 242 to allow access to the support surface 231 of the heaters 230. The top plate 245 has a top surface 246 and a bottom surface 249 defining a thickness of the top plate 245. The openings 242 can allow the heaters 230 to pass through the top plate 245. In some embodiments, the top plate 245 is fixed so that the top plate 245 moves vertically and rotates with the heaters 230.

Figure 6A:
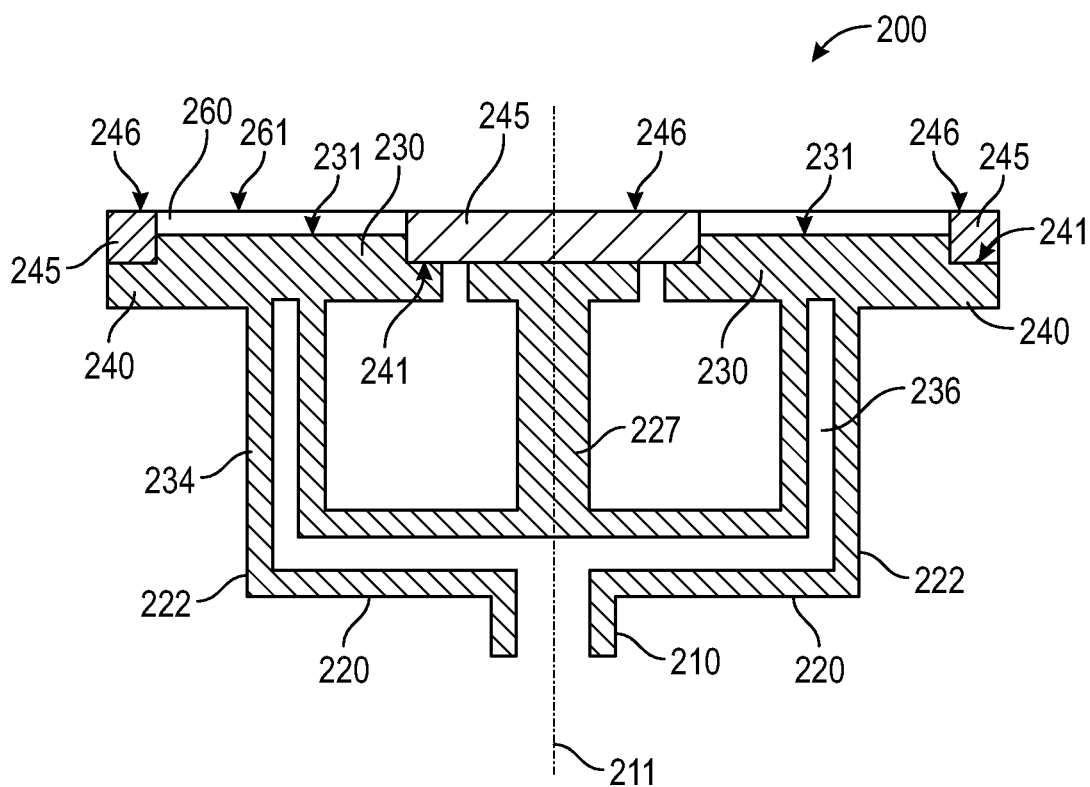
FIG. 6A shows a schematic cross-sectional view of a support assembly in accordance with one or more embodiment of the disclosure.
Figure 6B:
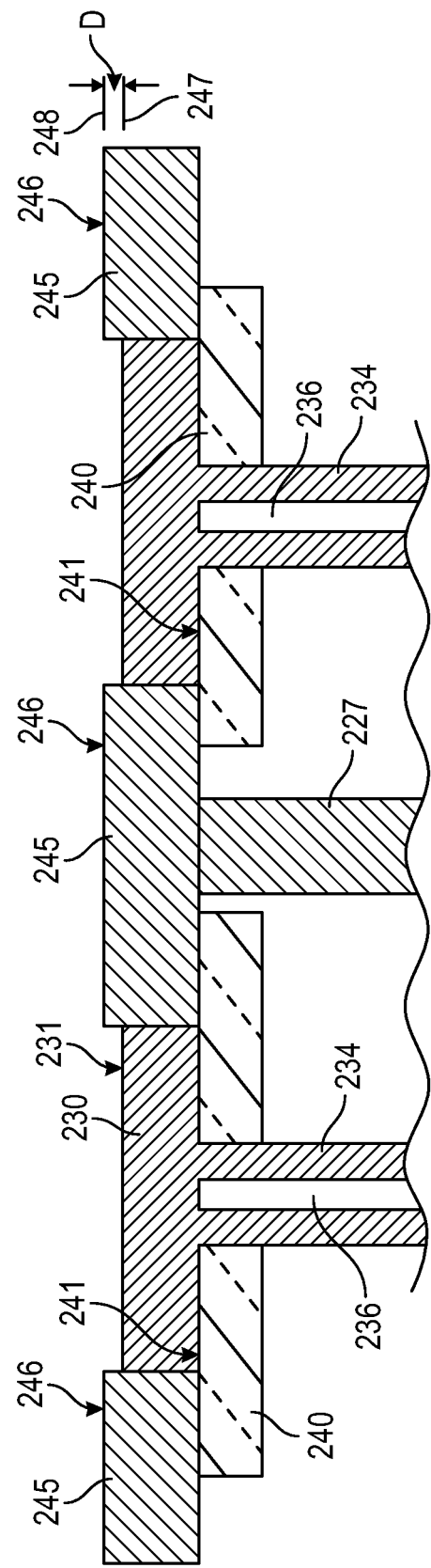
FIG. 6B shows a schematic cross-sectional view of a support assembly in accordance with one or more embodiment of the disclosure.

Referring to FIG. 6A, in some embodiments, the top plate 245 has a top surface 246 forming a major plane 248 that is substantially parallel with a major plane 247 formed by the support surface 231 of the heater 230. In some embodiments, the top plate 245 has a top surface 246 forming a major plane 248 that is a distance D above the major plane 247 of the support surface 231. In some embodiments, the distance D is substantially equal to the thickness of a substrate 390 to be processed so that the support surface 231 is coplanar with the top surface 246 of the top plate 245, as shown in FIG. 6B. As used in this manner, the term "substantially coplanar" means that the major plane formed by the surface of the substrate 390 is within ±1 mm, ±0.5 mm, ±0.4 mm, ±0.3 mm, ±0.2 mm or ±0.1 mm of coplanarity.

Figure 7:
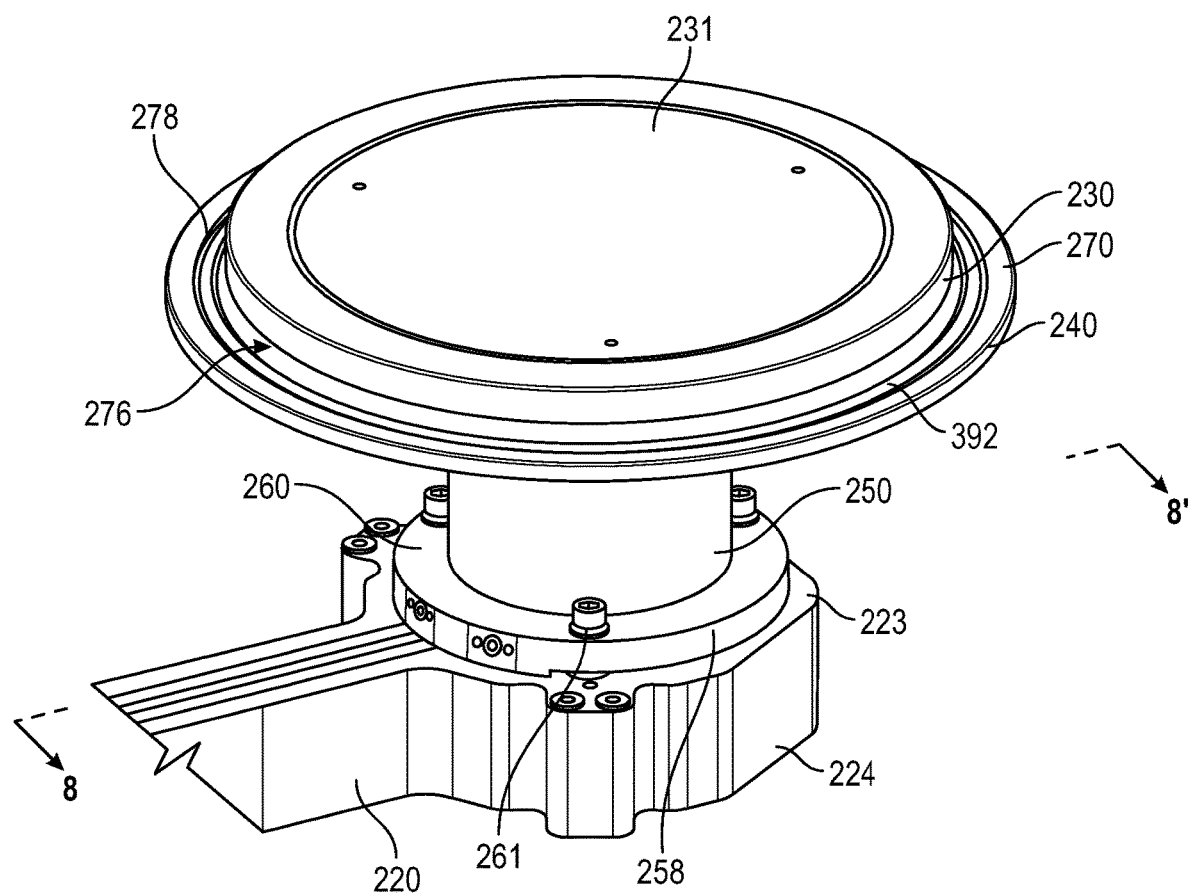
FIG. 7 shows a front perspective view of a heater assembly in accordance with one or more embodiment of the disclosure.
Figure 8:
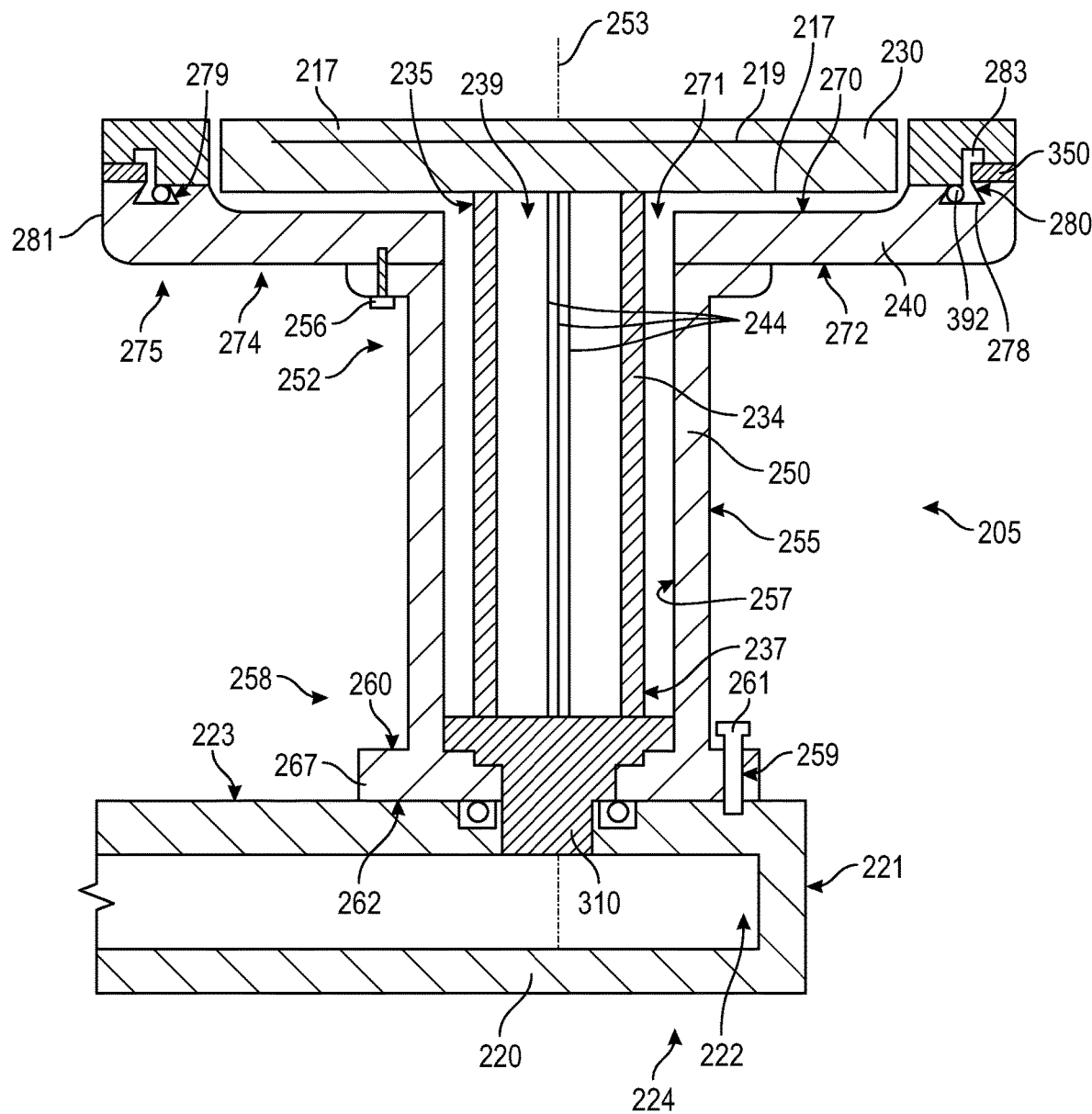
FIG. 8 shows a cross-sectional view of a heater assembly in accordance with one or more embodiments of the disclosure.

FIG. 7 shows an isometric view of a portion of a support assembly 200 with a heater assembly 205 in accordance with one or more embodiment of the disclosure. FIG. 8 shows a cross-sectional view of the portion of a support assembly 200 with the heater assembly 205 shown in FIG. 7, taken along line 8-8'. The shading in the Figures is used to aide in distinguishing the different components and does not imply any particular material of construction. In some embodiments, the heater assembly 205 comprises a heater 230, a heater standoff 234, and a shield made up of a shield shaft 250 and a shield plate 240.

The shield shaft 250 has an outside surface 255 and an inside surface 257 which surrounds each of the heater standoffs 234. The shield shaft 250 has a top end 252 and a bottom end 258 defining a length of the shield shaft 250. The shield shaft 250 of some embodiments has a shape that is concentric with the shape of the standoffs 234. In some embodiments, the shield shaft 250 has a substantially cylindrical body. As used in this manner, the term "substantially cylindrical" means that shape gives the overall appearance of being cylindrical and includes elongate oval shapes.

In some embodiments, the bottom end 258 of the shield shaft 250 comprises a bottom flange 267. The bottom flange 267 of some embodiments has a top surface 260 and a bottom surface 262 defining a thickness. In some embodiments, the bottom flange 267 extends outwardly from the outside surface 255. The bottom flange 267 of some embodiments provides space for fasteners or other components.

In some embodiments, at least three apertures 259 extend through the thickness of the bottom end 258. In some embodiments, the apertures 259 extend through the thickness of the flange 267 which is part of the bottom end 258. In some embodiments, the at least three apertures 259 are spaced around a central axis 253 of the shield shaft 250. In some embodiments, the at least three apertures 259 are equally spaced around the central axis 253. In some embodiments, there are three aperture 259 equally spaced around the central axis 253 so that, measured from the central axis 253, the apertures 259 are positioned at 120 degree intervals. In some embodiments, at least four apertures extend through the thickness of the bottom end 258, the at least four apertures are in a square planar configuration around the central axis of the shield shaft 250, in which each of the at least four apertures is positioned 90 degrees from one another.

In some embodiments, leveling fasteners 261 are disposed within each of the at least three apertures 259. The leveling fasteners 261 of some embodiments are used to both level and to secure the shield shaft 250 to the top surface 223 of the outer ends 224 of the support arms 220. The leveling fasteners 261 are configured to adjust the shield shaft 250 relative to the top surface 223 of the heater mounting base 222 normal. Stated differently, in some embodiments, the leveling fasteners 261 are configured to allow for adjustment of the shield shaft 250 so that the central axis 253 of the shield shaft is substantially perpendicular to)(±2° to the top surface 223 of the heater mounting base 222.

In some embodiments, as explained in further detail below, where calibration of the shield shaft 250 relative to the outer ends 224 of the support arms 220 is performed, one or more shims (not shown) of variable thickness are positioned around the leveling fasteners 261. In some embodiments, the one or more shims are positioned between the outer ends 224 of the support arms 220 and the bottom surface 262 of the shield shaft 250.

The heater standoff 234 comprises a top end 235 and a bottom end 237. The top end 235 of the heater standoff 234 is in contact with the bottom surface 232 of the heater 230. The bottom end 237 of the heater standoff 234 is in contact with the standoff mounting base 310. The standoff mounting base 310 of some embodiments is configured to secure the heater standoff 234 to the outer end 224 of the support arm 220. In some embodiments, the heater standoff 234 has an open inner channel 239 to allow electrical connections 244 to one or more of a thermal element 219 or electrodes 217 of the electrostatic chuck within the heater 230. The skilled artisan will be familiar with the construction of heaters and electrostatic chucks and will appreciate that the arrangement of thermal and electrical components within the heater 230 can be varied.

In the illustrated embodiment, the top end 235 of the heater standoff 234 is above the top end 252 of the shield shaft 250. In some embodiments, the top end 252 of the shield shaft 250 extends above the top end 235 of the heater standoff 234. In some embodiments, the top end 252 of the shield shaft 250 extends to the top end 235 of the heater standoff 234.

Figure 9:
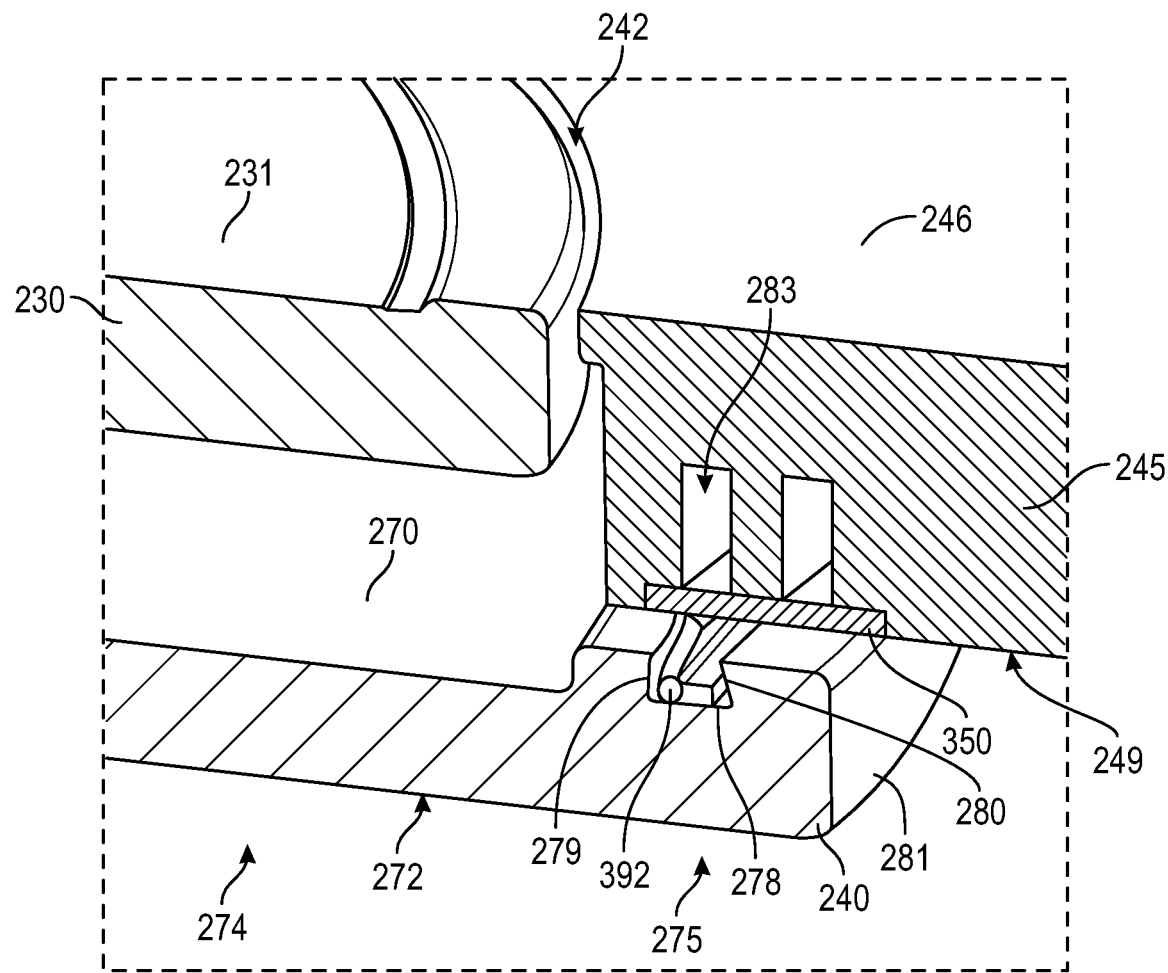
FIG. 9 shows a detailed cross-sectional view of a heater assembly in accordance with one or more embodiments of the disclosure.

As shown in FIGS. 8 and 9, a shield plate 240 has a top surface 270, a bottom surface 272 defining a thickness. The shield plate 240 further includes an opening 271 extending from the top surface 270 to the bottom surface 272. In some embodiments, as shown in the Figures, the bottom surface 232 of the heater 230 is spaced a distance from the top surface 270 of the shield plate 240. In some embodiments, the distance between the bottom surface 232 of the heater 230 and the top surface 270 of the shield plate 240 is in the range of 0.01 mm to 50 mm, or in the range of 0.25 mm to 40 mm, or in the range of 0.5 mm to 30 mm, or in the range of 1 mm to 20 mm.

The shield plate 240 has an inner portion 274, an outer portion 275 and an outer peripheral edge 281. In some embodiments, the outer portion 275 has a greater thickness than the thickness of the inner portion 274. In some embodiments, the bottom surface 272 of the shield plate 240 is in contact with the top end 252 of the shield shaft 250 and is secured with fasteners 256 extending through at least three apertures 254, the at least three apertures 254 extending through the top end 252. In some embodiments, the bottom surface 272 is welded to the top end 252 of the shield shaft 250. In some embodiments, the bottom surface 272 of the shield plate 240 has a greater thickness where the top end 252 is in contact with the bottom surface 272 of the shield plate 240. The greater thickness is for accommodating fastener holes configured to receive the fasteners 256.

FIG. 9 shows a portion of the outer edge of the heater 230 with top plate 245 and shield plate 240. In the illustrated embodiment, the shield plate 240 is positioned under the one of the at least one opening 242 of the top plate 245. The top surface 270 of the shield plate 240 further comprises a groove 278 with an inner face 279 and an outer face 280 extending around a peripheral portion 276 of the shield plate 240, the outer face 280 spaced a distance from an outer peripheral edge 281 of the shield plate 240.

At each of the at least one opening 242, the bottom surface 249 of the top plate 245 is in contact with the peripheral portion 276 of the top surface 270 of the shield plate 240. A first fluid seal 392 (also referred to as a "top fluid seal") is disposed within the ring-shaped groove 278 of the peripheral edge 281 to maintain low pressure conditions within the processing stations 110. The first fluid seal 392 is configured to non-uniformly compress around the periphery of the shield plate 240 such that, where uneven pressure is applied between the shield plate 240 and the top plate 245, the first fluid seal 392 still maintains atmosphere conditions within the processing station.

In some embodiments, a ring-shaped shim 350 having a thickness is positioned between the top surface 241 of the shield plate 240 (which is below the support surface 231 of the heater 230) and the bottom surface 249 of the top plate 245. The ring shaped shim 350 is configured to compress the first fluid seal 392 which is at least partially seated within the groove 278 of the shield plate 240. In some embodiments, the thickness of the ring shaped shim 350 can be configured to accommodate for variable distances between the top surface 241 of the shield plate 240 and the bottom surface 249 of the top plate 245. In some embodiments, the ring-shaped shim 350 has a variable thickness around the periphery of the ring. In some embodiments, the ring-shaped shim 350 comprises a plurality of individual pieces assembled in a ring-shape.

In some embodiments, a plenum 283 is formed between the ring-shaped shim 350 and the top plate 245. The plenum 283 can be any suitable shape and/or size as will be understood by the skilled artisan. The plenum 283 of some embodiments is connected to a vacuum source (e.g., vacuum pump, foreline) to prevent process gases from leaking out of the process region in the process stations.

In some embodiments, both the ring-shaped shim 350 and the first fluid seal 392 are configured to seal against gases leakage into or out of the process station and maintain vacuum integrity in the process station. In some embodiments, the first fluid seal 392 is configured to seal up to 1.5 mm, 1.25 mm, 1 mm, 0.75 mm or 0.5 mm vertical processing gap variation within the processing stations 110. The vertical processing gap is defined by the vertical distance between the support surface 231 and the front surfaces 114 of each of the gas injectors 112. In some embodiments, the shim 350 is provided having a larger thickness where the processing gap is too small. In some embodiments, the shim 350 is provided having a smaller thickness where the processing gap is too large. Likewise, the first fluid seal 392 can be oversized to account for processing gaps which are too small. In some embodiments, the first fluid seal is configured to seal against leakage and maintain vacuum integrity up to 1 mm vertical gap variation within a chamber.

The first fluid seal 392 can be any suitable compressible component known to the skilled artisan that is compatible with the process gases and process conditions. In some embodiments, the first fluid seal 392 is configured to have a maximum compression of 12% to 13%. In some embodiments, the first fluid seal 392 is configured to have a maximum compression in the range of 1% to 15%, or in the range of 5% to 14%, or in the range of 10% to 13% of the initial thickness of the first fluid seal 392.

The first fluid seal 392 is configured to be non-uniformly compressed to account for planar variation of the support surface 231. Planar variation can occur due to motor runout or due to variation in mechanical tolerances of one or more of the heater standoff 234, shield shaft 250, standoff mounting base 310, support arms 220 shield plate 240 and top plate 245. In some embodiments, first fluid seal is configured to accommodate up to 0.5 mm vertical gap variation between the shield plate 240 and the top plate 245.

Figure 10:
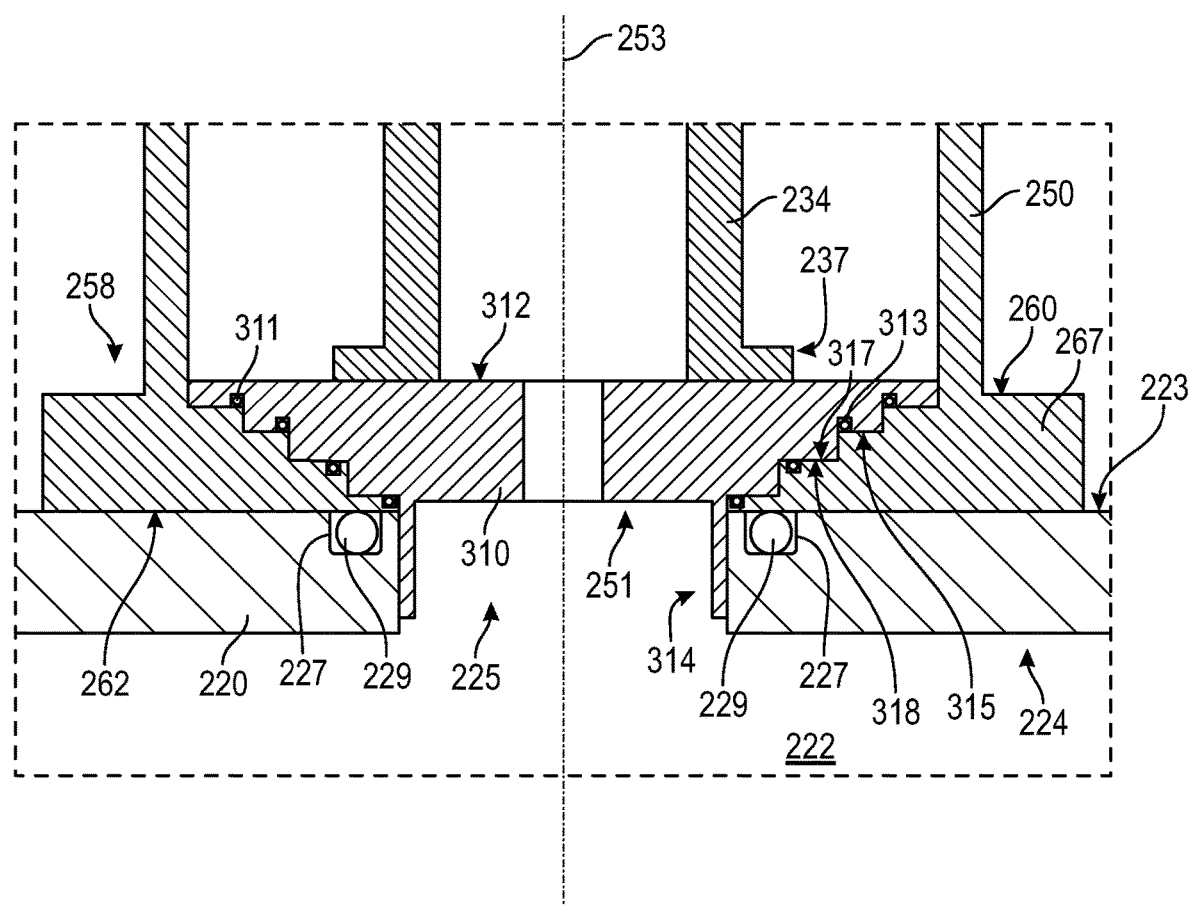
FIG. 10 shows a detailed cross-sectional view of a heater assembly in accordance with one or more embodiments of the disclosure.

Referring to FIG. 10, in some embodiments, a standoff mounting base 310 is connected to the bottom end 237 of the heater standoff 234 and the bottom end 258 of the shield shaft 250. The standoff mounting base 310 is configured to secure the heater standoff 234 and the shield shaft 250 to the outer ends 224 of the support arms 220. The standoff mounting base 310 has top end 312 and a bottom end 314, the top end 312 having a diameter greater than a diameter of the bottom end 314. A top surface 316 of the top end 312 is in contact with the bottom of the heater standoff 234.

The bottom end 314 of the standoff mounting base 310 is configured to interdigitate within an opening 225 of the top surface 223 of the support arms 220. In some embodiments, the bottom end 314 extends a depth into the opening 225 of the support arms 220. In some embodiments, the bottom end 314 is press-fit or interference fit within the opening 225.

In some embodiments, the bottom end 258 of the shield shaft 250 has an opening 251 to allow a lower portion 238 of the standoff mounting base 310 to extend through.

In some embodiments, the top end 312 of the standoff mounting base 310 further includes a plurality of stepped surfaces 315. In some embodiments, each of the plurality of stepped surfaces 315 have a progressively smaller diameter from the top surface 316 of the standoff mounting base 310 to the bottom surface 318 of the standoff mounting base 310. Each of the plurality of stepped surfaces 315 has a bottom surface 317 which is contact with corresponding steps of the inner flange 264 of the shield shaft 250. In some embodiments, one or more of each of the bottom surfaces 318 of the plurality of stepped surfaces 315 further include a channel 313 for receiving a plurality of fluid seals 311. The plurality of fluid seals 311 is configured to maintain low atmosphere environment within the shield shaft 250 upon compression of the plurality of fluid seals 311 between the bottom surfaces 317 of each of the plurality of stepped surfaces 315 and the corresponding steps of the inner flange 264 of the shield shaft 250. In some embodiments, the top surface 316 is partially recessed within the top end 312 of the standoff mounting base 310.

In embodiments having a plurality of processing stations 110, the support arms 220 comprise the outer end 221 as previously described. In embodiments having a single processing station, the heater mounting base 222 comprises a top surface 223 adjacent to the bottom surface 262 of the shield shaft 250. The top surface 223 of the heater mounting base 222 comprises an opening 225 connected to a hollow inner region of the heater mounting base 222. The opening 225 extends partially through the top surface 223. The opening 225 is concentrically located on a central axis of the heater mounting bases 222. The opening 225 is configured to allow for passage of electrical cables, fluid channels and gas channels through the hollow inner region of the heater mount base 222 through the standoff mounting base 310 into an open inner channel of the heater standoff 234. In some embodiments, the opening 225 is configured to receive the bottom portion of 314 the standoff mounting base 310.

The top surface 223 further includes a ring-shaped groove 227 for receiving a second fluid seal 229 (also referred to a "bottom fluid seal") disposed around the opening 225. The second fluid seal 229 is in contact with the bottom surface 268 of the shield shaft 250. The second fluid seal 229 is configured to allow movement of the shield shaft 250 relative to the top surface 223 of a heater mounting base 222.

The second fluid seal 229 configured to allow for at least one shim (not shown) to be positioned between the bottom surface 268 of the shield shaft 250 and the top surface 223 of the heater mounting base 222. In some embodiments, the at least one shim is a ring shaped shim positioned around the opening 225. In some embodiments, the at least one shim is positioned between fasteners securing the bottom end 258 of the shield shaft 250 to the top surface 223 of the support arms 220.

In some embodiments, the first fluid seal 392 and the second fluid seal 229 are O-rings. In some embodiments, the first fluid seal 392 and the second fluid seal 229 are V-rings. In some embodiments, the first fluid seal 392 and the second fluid seal 229 are L-rings.

The shield plate 240 and the shield shaft 250 form a uniform heater shield assembly. The heater shield assembly forms a uniform cavity sealed against leakage by the first fluid seal 392 and the second fluid seal 299, maintaining vacuum integrity within the uniform cavity. The heater shield assembly, also referred to as a thermal shield assembly) increases the uniformity of temperature loss around the heater 230.

Figure 11:
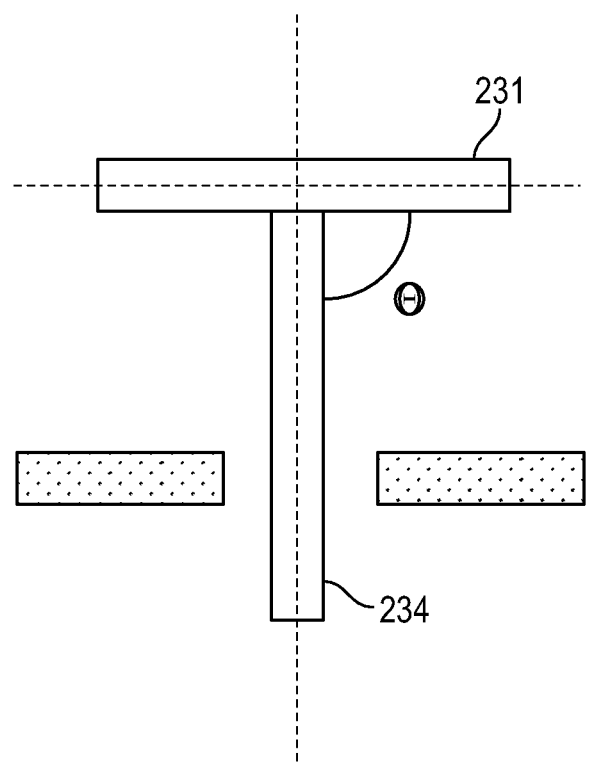
FIG. 11 shows a schematic cross-sectional view of a heater assembly in accordance with one or more embodiments of the disclosure.
Figure 12:
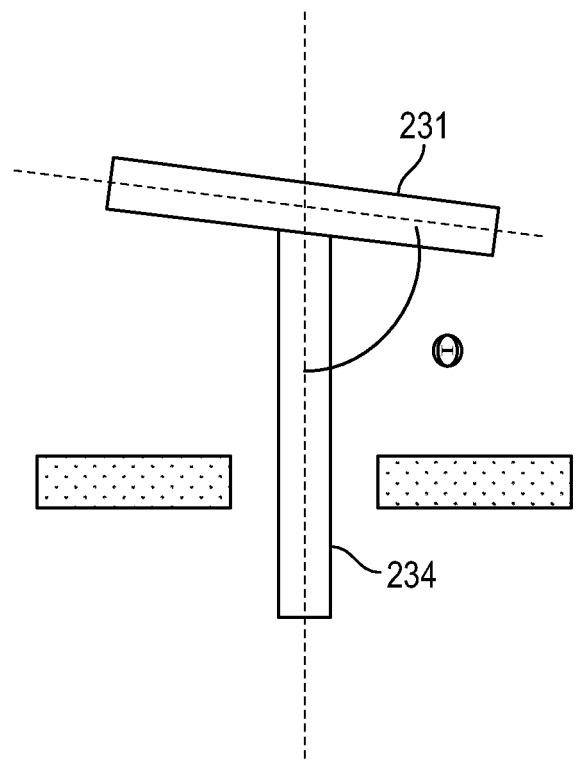
FIG. 12 shows a schematic cross-sectional view of a heater assembly in accordance with one or more embodiments of the disclosure.
Figure 13:
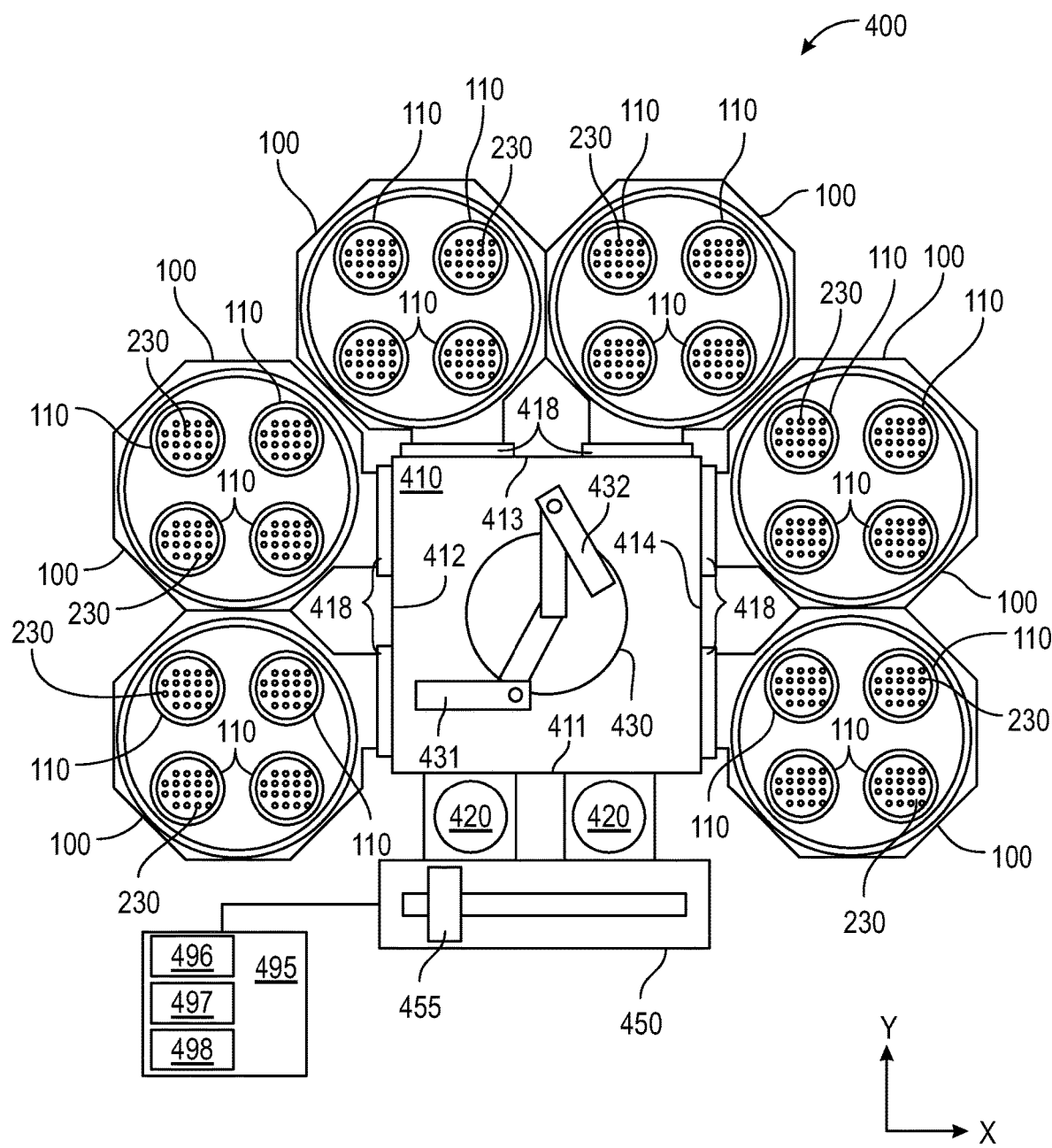
FIG. 13 shows a schematic representation of a processing platform in accordance with one or more embodiment of the disclosure.

As shown in FIGS. 11 and 12, each of the support surfaces 231 of the heaters 230 are substantially coplanar to each of the other support surfaces 231 of heaters 230. In some embodiments the support surfaces 231 is at an angle Θ with respect to the heater standoff 234, Post-calibration, the angle Θ is at 90 degrees, thereby providing a horizontally level surface for the support surfaces 231.

As shown in FIG. 12, motor runout can cause the support surfaces 231 and heater standoffs 234 to be in a state of improper alignment, wherein the angle Θ is no longer substantially 90 degrees. Continuous cycles and torsional force scan also contribute to improper alignment, thus inducing wobble, interior volume variation within the processing chambers, or variation in the separation gap distance.

In some embodiments, a plurality of displacement sensors is utilized to mechanically correct improper alignment, whereby support surfaces 231 are brought into proper alignment with the top plate 245. In some embodiments, mechanical correction includes, but is not limited to, shimming a connection point or flange between the heater standoff 234 and heater 230, shimming a connection point between the heater standoff 234 and the support arms 220, adjusting fasteners of the top end 252 of the shield shaft 250, bottom end 258 of the shield shaft 250. Calibration can further include placement of shims between the fasteners 256 of the top end 252 of the shield shaft 250, placement of shims between the leveling fasteners 261 of the bottom end 258 of the shield shaft 250. Mechanical calibration can also include placement or adjustment of the thickness of the ring-shaped shim 350 to accommodate for vertical processing gap deviation.

In some embodiments, as described in further detail below, runout and wobble due to the heater standoff 234 being in improper alignment as shown in FIG. 12 is calibrated. After runout and wobble of the heater standoff 234 is corrected and brought into proper alignment, the angle Θ is brought into proper alignment of substantially 90 degrees.

In some embodiments, a plurality of the displacement sensors are preferably laser displacement sensors, whereby the laser beam is directed towards support surface 231. The displacement sensors are configured to measure a distance from the sensor to a point on the support surface 231. In some embodiments, the displacement sensors are also configured to measure a distance between the sensor and a point on the top surface 246 of the top plate 245

In embodiments described, the displacement sensors are part of at least one set of three sensors. Each of the set of three sensors is configured to measure the distance from the sensor to a point on the surface, whereby three sensors measure the distance to three points on said surface. In some embodiments, the set of three sensors are positioned an equal distance from one another in an equilateral triangular configuration, the triangular configuration being in the x-y plane having a central axis relative to the surface being calibrated for coplanarity.

In embodiments described, the displacement sensors are configured to measure parallelism of a support surface 231 with respect to the corresponding set of three sensors. Parallelism of said surface with respect to the set of three sensors is calculated by the distance between each of the three sensors and a point on the surface, the distance being in the z-plane relative to the x-y plane of the triangular configuration of the sensors. In some embodiments, the displacement sensors are configured to measure parallelism of opposite support surfaces 231 with respect to the corresponding two set of three sensors. In some embodiments, the displacement sensors are configured to measure parallelism of multiple support surfaces 231 with respect to the displacement sensors. In some embodiments, the displacement sensors are configured to measure parallelism of the top surface 246 of the top plate 245 with respect to the corresponding set of three sensors.

FIG. 14 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the –axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

A power supply 530 is connected to the electrodes 521, 522 to generate the voltage differential between the electrodes 521, 522. The power supply 530 connects through transmission lines 531, 532 to the electrodes 521, 522. The transmission lines 531, 532 are electrically separated by any suitable insulator to prevent shorting or arcing.

The power supply 530 of some embodiments provides a first voltage (also referred to as potential) to the electrode 521 and a second voltage to the electrode 522 that is different from the first voltage. In some embodiments, the power supply 530 is configured to provide high voltage direct current (DC) and a low voltage alternating current (AC) component to the electrodes 521, 522.

In one or more embodiments of the disclosure, the power supply 530 includes or is connected to a capacitance sensor 535. In some embodiments, the capacitance sensor 535 is a separate sensor within the body 502 of the substrate support 500, as shown in FIG. 2. In some embodiments, the capacitance sensor is a part of the electronics of the power supply 530.

In some embodiments, the controller 590 is connected to the at least one heating element 540 and is configured to control power to the at least one heating element 540. In some embodiments, the controller 590 is connected to a temperature sensor (e.g., pyrometer, thermocouple, etc.) to measure the temperature of a substrate or of the substrate support 500 and to change the power to the heating element 540 to maintain a predetermined temperature.

In some embodiments, the controller 590 is connected to the displacement sensors and is configured to determine the deviation of at least the vertical processing gap. The controller 590 is further configured to determine coplanarity of the support surfaces 231 and provide shimming values for mechanical calibration. The controller 590 is further configured to measure one or more of a process gap between a substrate and a shower head, a lift pin actuation plane, top surface planarity, heater standoff 234 runout, heater standoff 234 deflection due to vacuum and parallelism of a heater to a showerhead.

A method of calibrating the processing chamber 100 under vacuum according to one or more embodiment of the disclosure is described. The method comprises the steps of: aligning a top surface of one or more support surfaces 231 located within an interior volume 109 with a chamber lid 300 to establish a process gap, the one or more support surfaces 231 connected to a support post 190 that extends through an opening 120 in the chamber floor 106 and an opening in a support plate 320 attached to a bottom surface 118 of the chamber floor 106; and creating a vacuum environment within the interior volume 109 causing the chamber floor 106 to deflect toward the interior volume 109 while maintaining the process gap. The process gap is between 1 mm and 2 mm.

Referring back to FIGS. 1, 2, 3A and 3B, one or more embodiments of the disclosure are directed to processing chambers 100. The processing chambers comprise a support plate 320 for mitigating effects of deflection of the chamber floor 106 due to low atmosphere conditions within the interior volume 109. A support post 190 extends through the chamber floor 106 and support plate 320 while a bellows assembly 340 separates atmospheric environment outside the interior volume 109 from vacuum or low atmosphere conditions within the interior volume 109.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A heater assembly comprising:
   a heater comprising a support surface and a bottom surface defining a thickness;
   a heater standoff having a top end and a bottom end, the top end in contact with the bottom surface of the heater;
   a shield shaft having a top end and a bottom end, an inside surface surrounding an open interior region and an outside surface, the heater standoff located within the open interior region and the top end of the heater standoff extending above the top end of the shield shaft; and
   a shield plate having a top surface, a bottom surface and an outer peripheral edge, the shield plate having an opening extending from the top surface to the bottom surface in an inner portion, the heater standoff extending through the opening in the shield plate, the bottom surface of the heater spaced a distance from the top surface of the shield plate, the top surface of the shield plate having a groove with an inner face and an outer face extending around a peripheral portion of the shield plate, the outer face spaced a distance from the outer peripheral edge of the shield plate.

2. The heater assembly of claim 1, wherein the shield shaft comprises a top flange extending outwardly from the outside surface and the shield shaft is connected to the shield plate with fasteners extending through the top flange.

3. The heater assembly of claim 1, further comprising a standoff mounting base connected to the bottom end of the heater standoff.

4. The heater assembly of claim 3, wherein the standoff mounting base is connected to the bottom end of the shield shaft.

5. The heater assembly of claim 4, wherein the bottom end of the shield shaft has an opening to allow a lower portion of the standoff mounting base to extend through.

6. The heater assembly of claim 5, further comprising a heater mounting base with a top surface, the bottom surface of the shield shaft positioned adjacent the top surface of the heater mounting base.

7. The heater assembly of claim 6, wherein the top surface of the heater mounting base comprises an opening connected to a hollow inner region of the heater mounting base.

8. The heater assembly of claim 7, wherein the lower portion of the standoff mounting base extends at least partially into the opening in the top surface of the heater mounting base to allow electrical connections to pass through the hollow inner region of the heater mounting base through the standoff mounting base and into an open inner channel of the heater standoff.

9. The heater assembly of claim 6, wherein a fluid seal is disposed within a circular groove of the top surface of the heater mounting base, the fluid seal allowing movement of the shield shaft relative to the top surface of a heater mounting base.

10. The heater assembly of claim 9, wherein the bottom surface of the shield shaft comprises a bottom flange extending outwardly from the outside surface of the shield shaft.

11. The heater assembly of claim 10, further comprising a plurality of leveling fasteners extending through bottom flange of the shield shaft into the heater mounting base, the leveling fasteners configured to adjust the shield shaft relative to the top surface of the heater mounting base.

12. The heater assembly of claim 1, further comprising a top plate having a top surface and a bottom surface defining a thickness of the top plate, the top plate having an opening through the thickness to allow the heater to pass through the opening, the bottom surface of the top plate in contact with a fluid seal in the groove in the top surface of the shield plate.

13. The heater assembly of claim 12, further comprising a ring-shaped shim having a top surface and a bottom surface defining a thickness of the ring-shaped shim, the ring-shaped shim positioned round the heater between the top surface of the shield plate and the bottom surface of the top plate.

14. The heater assembly of claim 13, wherein the fluid seal is configured to seal against atmosphere and maintain vacuum integrity up to 1 mm vertical gap variation between the top surface of the shield plate and the bottom surface of the top plate.

15. The heater assembly of claim 14, wherein the fluid seal is configured to be non-uniformly compressed.

16. The heater assembly of claim 14, wherein the fluid seal is configured to accommodate up to 0.5 mm vertical gap variation between the shield plate and the top plate.

17. The heater assembly of claim 14, wherein the fluid seal is configured to have a minimum compression of 2% to 3% at the 0.5 mm gap between the shield plate and the top plate.

18. The heater assembly of claim 14, wherein the fluid seal is configured to have a maximum compression of 12% to 13%.

* * * * *